(12) United States Patent
Bell

(10) Patent No.: US 7,463,472 B1
(45) Date of Patent: Dec. 9, 2008

(54) SIGNAL SPLITTER/SURGE PROTECTOR

(75) Inventor: Ronnie L. Bell, Nashua, NH (US)

(73) Assignee: American Power Conversion Corporation, West Kingston, RI (US)

( * ) Notice: Subject to any disclaimer, the term of this patent is extended or adjusted under 35 U.S.C. 154(b) by 637 days.

(21) Appl. No.: 11/036,488

(22) Filed: Jan. 14, 2005

Related U.S. Application Data

(60) Provisional application No. 60/536,404, filed on Jan. 14, 2004.

(51) Int. Cl.
*H02H 9/00* (2006.01)
(52) U.S. Cl. .................................................. 361/118
(58) Field of Classification Search ................ 361/118
See application file for complete search history.

(56) References Cited

U.S. PATENT DOCUMENTS

| | | | | |
|---|---|---|---|---|
| 5,726,851 A | * | 3/1998 | Knapp | 361/104 |
| 6,018,452 A | * | 1/2000 | Meyerhoefer et al. | 361/111 |
| 6,738,474 B1 | * | 5/2004 | Miller | 379/413.03 |
| 6,895,089 B2 | * | 5/2005 | Wang | 379/387.01 |
| 7,268,993 B2 | * | 9/2007 | Dement | 361/119 |
| 2003/0192063 A1 | * | 10/2003 | Runkle | 725/149 |

* cited by examiner

*Primary Examiner*—Stephen W Jackson
(74) *Attorney, Agent, or Firm*—Townsend and Townsend and Crew LLP

(57) ABSTRACT

A circuit for providing surge protection and signal splitting includes an input configured to received a signal, a current-limiting device having first and second portions, the first portion coupled to the input, the current-limiting device being configured to provide a short circuit between the first and second portions in the absence of an excess current and to provide an open circuit in response to the excess current, a voltage suppression device coupled to the second portion of the current-limiting device and configured to conduct to a ground if a signal received by the voltage suppression device is above a threshold voltage, a signal splitter coupled to the second portion of the current-limiting device and configured to split an incoming signal into multiple output signals, and outputs coupled to the signal splitter to receive the output signals.

21 Claims, 8 Drawing Sheets

SIGNAL SPLITTER/SURGE PROTECTOR

CROSS-REFERENCE TO RELATED ACTIONS

This application claims the benefit of U.S. Provisional Application No. 60/536,404 filed Jan. 14, 2004, which is incorporated here by reference.

BACKGROUND OF THE INVENTION

Today's society relies heavily on the quick, accurate transfer of data, often over long distances and through many devices such as telecommunication network devices. Examples of data signals include television signals, telephone signals, emails, and Internet traffic such as web browsing data, video and audio data, etc. Such information often travels through cables that are subject to power surges, e.g., by being exposed to lightning strikes or other power surge inducing events. The data also often is transmitted to and/or from data centers that provide various functions, e.g., routing and other services, e.g., through servers in the data centers. Data signals in the data centers may be divided or split from one incoming signal into multiple outgoing signals to be provided to multiple devices.

Presently, to provide protection against power surges and to provide multiple output lines from a single input line, typically separate surge protectors and line splitters are employed. Typical 2-way splitters introduce about a 3.5 dB loss to the signal and typical surge protectors introduce about a 2.4 dB loss to the signal, thus combining for about 5.9 dB of loss to a signal to provide surge protection and split the signal

SUMMARY OF THE INVENTION

In general, in an aspect, the invention provides a circuit for providing surge protection and signal splitting, the circuit including an input configured to received a signal, a current-limiting device having first and second portions, the first portion coupled to the input, the current-limiting device being configured to provide a short circuit between the first and second portions in the absence of an excess current and to provide an open circuit in response to the excess current, a voltage suppression device coupled to the second portion of the current-limiting device and configured to conduct to a ground if a signal received by the voltage suppression device is above a threshold voltage, a signal splitter coupled to the second portion of the current-limiting device and configured to split an incoming signal into multiple output signals, and outputs coupled to the signal splitter to receive the output signals.

Implementations of the invention may include one or more of the following features. The circuit further includes an inductor coupled to the second portion of the current-limiting device and to the voltage suppression device and configured to have a high impedance relative to an input impedance of the signal splitter if the signal at the second portion has a frequency in a desired frequency range. The inductor comprises multiple inductors coupled in series. The inductor is a ferrite inductor. The desired frequency range is above about 500 MHz. The signal splitter is coupled to the second portion of the current-limiting device without an intermediate connector. The current-limiting device is a fuse. The fuse is coupled to the signal splitter with a metallic trace of a first width, and wherein the fuse comprises a metallic trace of a second width substantially smaller than the first width. The second width is about 40% of the first width. The first width is about 0.05 inches and the second width is about 0.02 inches. The threshold voltage is about 28 volts.

In general, in another aspect, the invention provides a replaceable module for use in rack-mounted equipment for providing surge protection and signal splitting, the module including a housing configured to be removably inserted into a chassis configured to mount in an equipment rack, an input connector configured to connect to a mating connector and to receive electric signals, a fuse coupled to the input connector, the fuse being configured to provide a short circuit in the absence of an excess current and to provide an open circuit in response to the excess current, a voltage suppression device coupled to the fuse and configured to conduct to a ground if a signal received by the voltage suppression device is above a threshold voltage, a signal splitter coupled to the fuse and configured to split an incoming signal received by the splitter from the fuse into multiple output signals, and output connectors coupled to the signal splitter to receive the output signals.

Implementations of the invention may include one or more of the following features. The signal splitter is coupled to the fuse without an intermediate connector. The module is further configured to inhibit signals having frequencies in a desired frequency range from reaching the voltage suppression device. The threshold voltage is about 28 volts and the desired frequency range is from about 500 MHz to about 2 GHz. The fuse is coupled to the signal splitter by a metallic trace of a first width and the fuse comprises a metallic trace of a second width that is substantially smaller than the first width such that a current of 200 amps will cause the fuse to provide the open circuit. The signal splitter is configured to split the incoming signal into three output signals. The signal splitter comprises two 1-to-2 signal splitters coupled in series.

In general, in another aspect, the invention provides a rack-mountable system for providing surge protection and signal splitting for a plurality of input video signals, the system including a chassis configured to be mounted in an equipment rack, video signal modules configured to be removably inserted into the chassis, the modules each comprising: an input connector configured to connect to a mating connector and to receive electric signals; a fuse coupled to the input connector, the fuse being configured to provide a short circuit in the absence of a current exceeding a current threshold and to provide an open circuit in response to the excess current; a voltage suppression device coupled to the fuse and configured to conduct to a ground if a signal received by the voltage suppression device is above a voltage threshold; a signal splitter coupled to the fuse and configured to split an incoming signal received by the splitter from the fuse into multiple output signals; output connectors coupled to the signal splitter to receive the output signals; and a signal inhibitor coupled in series between the fuse and the voltage suppression device and configured to inhibit signals having frequencies in a desired frequency range from reaching the voltage suppression device.

Implementations of the invention may include one or more of the following features. The signal splitter is coupled to the fuse without an intermediate connector. The fuse and the signal splitter are disposed on a single printed circuit board. The signal splitters are each configured to split the corresponding incoming signal into either two output signals or three output signals.

Various aspects of the invention may provide one or more of the following capabilities. Surge protection and signal splitting can be provided in an integrated platform. Surge protection and signal splitting can be provided with less loss introduced than using previous techniques. A surge protector may be provided that blocks signals in response to voltages that are lower and/or more precisely known in advance of receipt of the signals than previous techniques. Undesired "blowing" of a surge protection fuse can be reduced compared to prior techniques. A power device can clamp a voltage input to a signal splitter.

These and other capabilities of the invention, along with the invention itself, will be more fully understood after a review of the following figures, detailed description, and claims.

DETAILED DESCRIPTION OF PREFERRED EMBODIMENTS

Embodiments of the invention provide techniques for providing surge protection and signal splitting in an integrated device. For example, modules are provided for rack-mounted equipment with the modules including a printed circuit board (PCB). The PCB includes connecting traces with a choked section providing surge protection for downstream components. Further, a device is connected to the choked-trace section to provide further surge protection. The device directs low-frequency signals to a voltage suppression device that passes large power signals to ground, while inhibiting higher-frequency signals from the voltage suppression device such that such signals are provided to a signal splitter. The signal splitter may be configured to divide the incoming signal into two or more outgoing signals. Other embodiments are within the scope of the invention.

Figure 1:
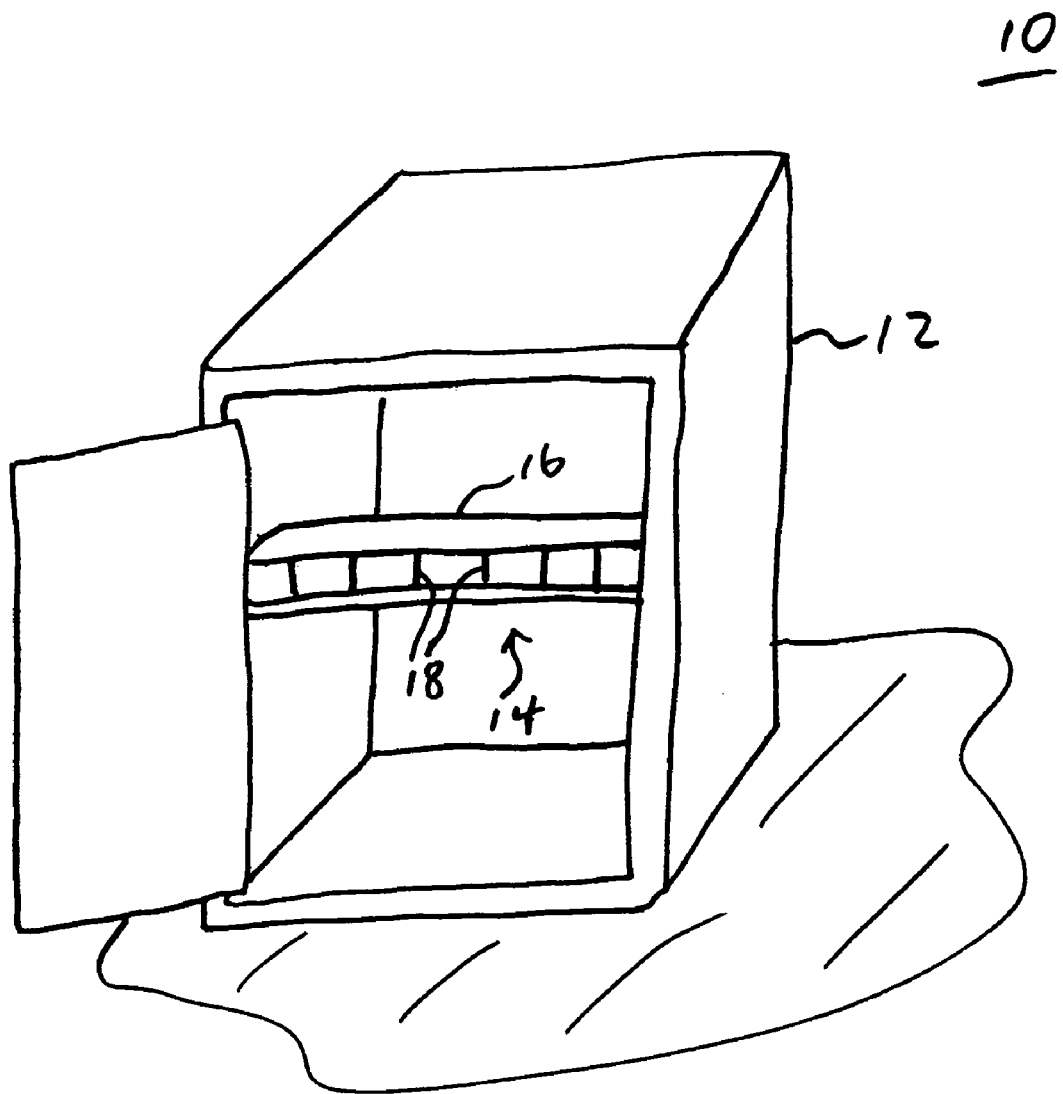
FIG. 1 is a simplified perspective diagram of a data center rack and an exemplary piece of rack-mounted equipment that provides surge protection and signal splitting.
Figure 2:
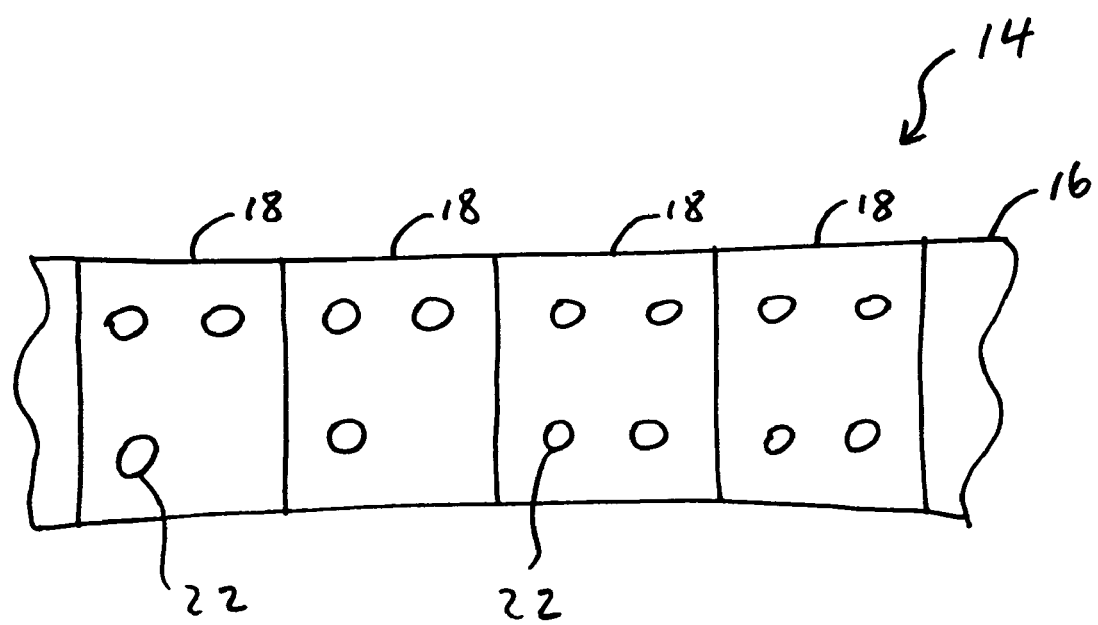
FIG. 2 is a simplified front view of a portion of the rack-mounted equipment shown in FIG. 1.

Referring to FIGS. 1-2, a data center 10 includes an equipment rack 12 for housing rack-mounted equipment, and a piece of rack-mounted equipment 14. The rack 12 is a standard-sized equipment rack (e.g., for 19" wide equipment chassis). The equipment 14 includes a chassis 16 and multiple replaceable surge protector/signal splitter modules 18. The modules 18 are configured to split incoming data signals into two or more outgoing signals while inhibiting power surges on incoming lines from damaging components in the modules 18, e.g., signal-splitting circuitry. As shown, some of the modules 18 provide 1-to-2 signal splitting and have three connectors 22, one for incoming signals and two for outgoing signals, while other of the modules 18 provide 1-to-3 signal splitting and have four connectors 22, one for incoming signals and three for outgoing signals.

Figure 3:
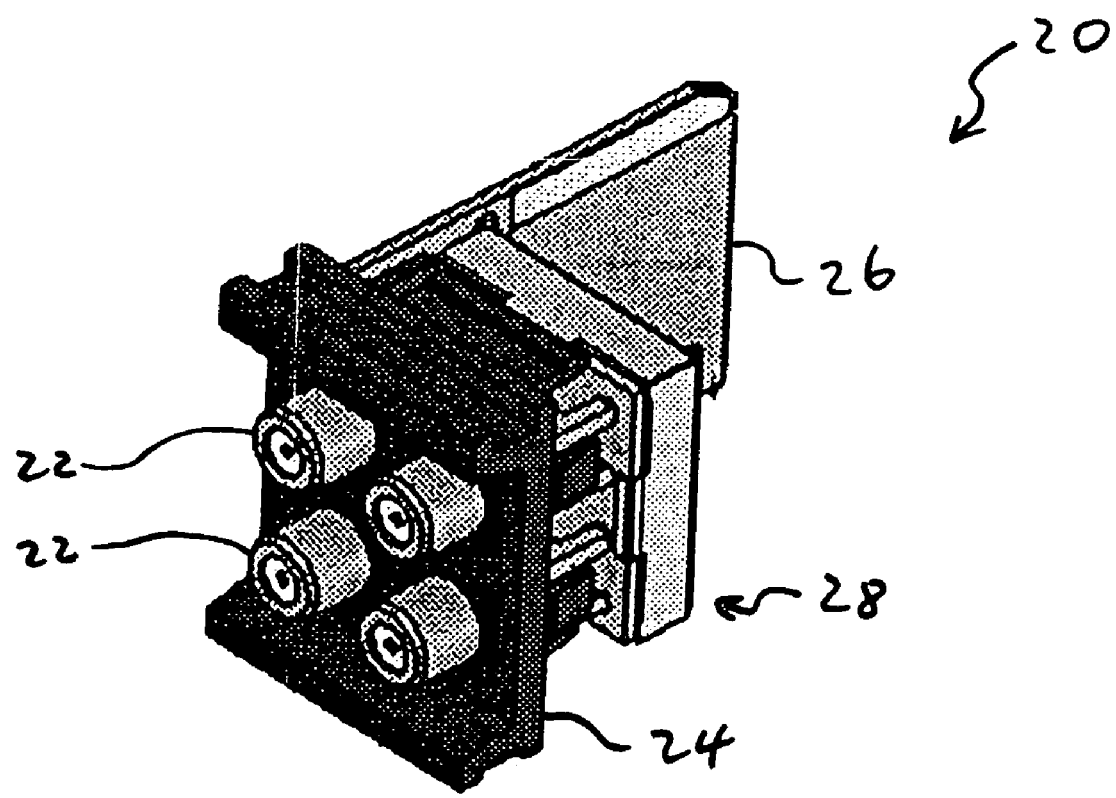
FIG. 3 is a simplified perspective view of a module of the rack-mounted equipment shown in FIG. 2.

Referring to FIG. 3, an exemplary surge protector/signal splitter module 20 includes connectors 22, a housing 24, a PCB 26, and a ground plane connector 28. Here, the connectors 22 are F-connectors for use in connecting video cables for transmitting video signals (e.g., for cable television), although other connectors and other types of signals may be used. The module 20 includes four connectors 22, with one of the connectors being an input connector for receiving an incoming video signal and three output connectors for providing the input signal split three ways. The connectors 22 are connected to the PCB 26 with a transition between coaxial lines used by the connectors 22 and lines used on the PCB 26. The PCB 26 is in turn connected through the ground plane connector 28 to ground. The PCB 26 includes lines and electrical components as described below to implement surge protection circuitry and signal splitting on the PCB 26 without connectors between the circuitry for providing these functions.

Figure 4:
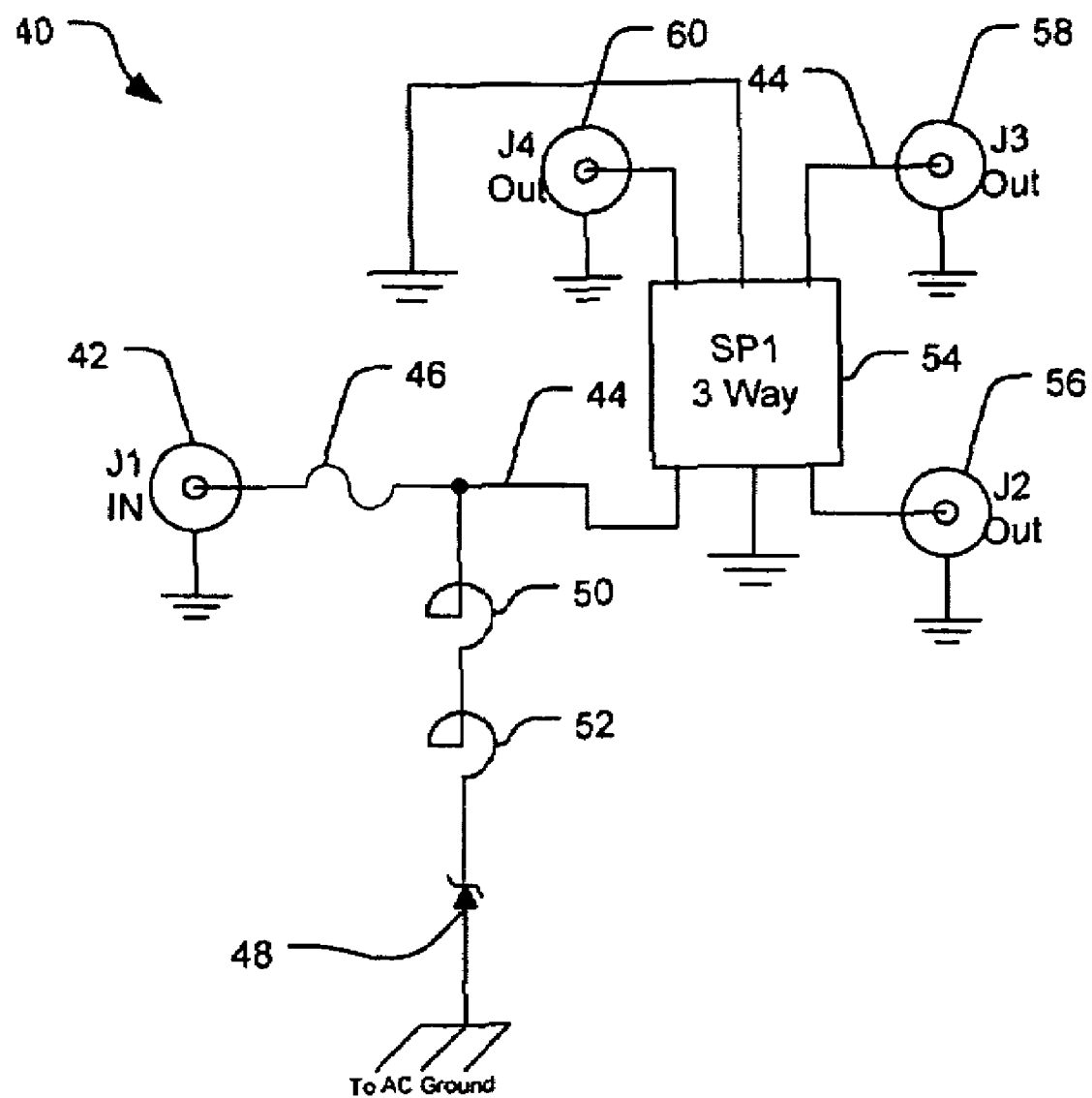
FIG. 4 is a simplified circuit diagram of a combined surge protector and 1-to-3 signal splitter.

Referring to also FIG. 4, an exemplary circuit 40 disposed on the PCB 26 for providing surge protection and signal splitting includes an input 42, connecting lines 44, a fuse 46, a voltage-suppression device (VSD) 48, inductors 50, 52, a signal splitter 54, and outputs 56, 58, 60. The input 42 is coupled to the input connector 22 of the module 20. The connecting lines 44 are copper traces although other forms of transmission lines may be used. The traces may be, e.g., about 0.050" wide for a 0.062" thick board with 2 oz. copper plating. The circuit 40 is configured to guard against power surges received at the input 42 and to split the signal received at the input 42 into three signals. The circuit 40 has been found to introduce about 2 dB less loss than previous techniques for both splitting signals and providing power surge protection. Here, the VSD is a Transient Voltage Suppressor made by Fairchild Semiconductor Corporation of South Portland, Me., part number SMCJ28CA.

Figure 8:
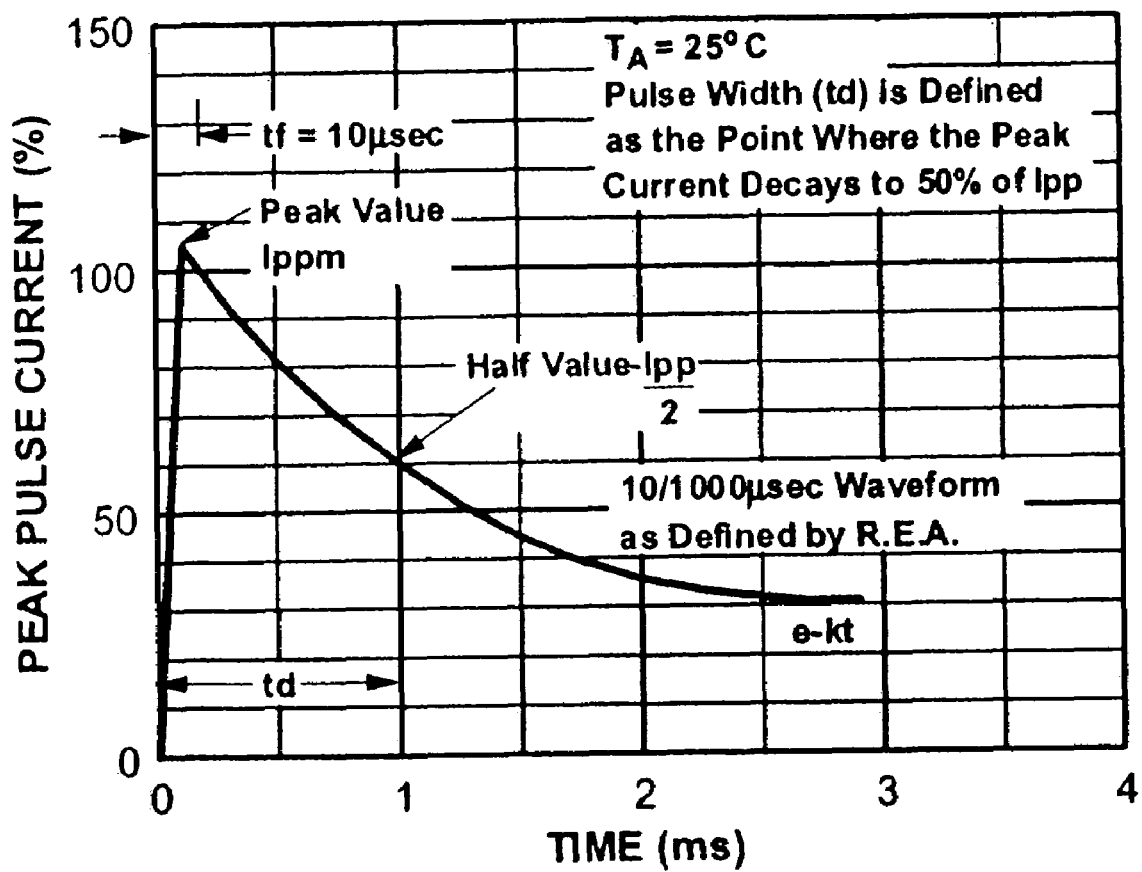
FIG. 8 is a pulse waveform associated with a voltage suppression device shown in FIG. 4.

The fuse 46 is configured to inhibit high amounts of power from reaching the components of the circuit 40 inboard of the fuse 46, e.g., the splitter 54. The fuse 46 is preferably configured in conjunction with the VSD 48 to open at a current that is higher than the non-repetitive current rating to which the VSD will limit the incoming signal and that is below a voltage that would induce damage to the inboard components. For example, the fuse 46 may be designed to open in response to current exceeding the 200 amp, 10/1000 us waveform shown in FIG. 8.

The VSD 48 is configured to limit the voltage of signals provided to the splitter 54 to no more than about 30V (e.g., about 28V). The fuse 46 is configured to permit (conduct without opening) signals with voltages below an undesirable level for the inboard components (including voltages above a clamping voltage of the VSD 48) to reach the inboard components. Here, the fuse 46 is a reduced-width transmission line trace that is about 0.020" wide, or about 40% of the width of the lines 44. The width of the fuse 46 can be selected very precisely and thus the current at which the fuse 46 open circuits can be reasonable set. Incoming signals may have voltages above a desired voltage (e.g., 30V) and the fuse 46 will allow such signals to pass while the VSD 48 (as discussed below) will limit such signals to about 30V by conducting for voltages higher than about 28V. The fuse 46 is preferably configured to open in the event the VSD 48 fails to short due to an excessive surge condition, such as a power line shorting out to the CATV cable outside of a home. Voltages higher than the desired voltage may be inhibited from reaching the splitter 54 while not inducing the fuse 46 to open (blow), thereby reducing the number of blown fuses and thus the amount of replacements of the fuse 46 and/or the circuit 40 (e.g., by replacing the module 20) induced by voltages between the VSD-conducting voltage and the fuse-opening current.

The inductors 50, 52 are configured to selectively inhibit signals from reaching the VSD 48 and selectively conduct signals to the VSD 48. The inductors 50, 52 are configured to have relatively high impedances (e.g., above about 650% each) over a desired frequency range of incoming signals (e.g., about 500 MHz to about 2 GHz for video signals) with zero current through the inductors 50, 52 which is typical The inductors 50, 52 present relatively low impedances for signals with relatively-low frequencies (e.g., below about 70Ω each for 10 MHz signals, or below about 15-20Ω each for 100 kHz signals, in this example). The inductors 50, 52 are configured to conduct power surge signals to the VSD 48 as such surges have low frequencies (e.g., less than about 1 kHz (see FIG. 8). The inductors 50, 52 substantially conduct low-frequency signals (e.g., below about 1 KHz) to the VSD 48 and substantially isolate the VSD 48 from desired-frequency signals (signals with frequencies in the desired range). Here, for example, the inductors 56, 58 are each model number H12220P551R-00 ferrite bead inductors made by Steward, Inc. of Chattanooga, Tenn., although other inductors, including other types of inductors, may be used. While the inductors 56, 58 are configured similarly in this example, they may be configured differently. Further, although two inductors are shown in FIG. 4, a single inductor or more than two inductors could be used to achieve desired impedance amounts of the desired frequency range.

The VSD 48 is configured to conduct signals with voltages above the desired voltage to clamp the voltage provided to the downstream components at a predetermined amount. Here, for example, the VSD 48 is configured to conduct when a voltage applied to the VSD 48 exceeds a threshold voltage of about 28V (for a 30V-limit design). The VSD 48 thus will clamp the voltage provided to the splitter 54 at the threshold at which it conducts.

In combination, the inductors 50, 52 and the VSD 48 inhibit low-frequency, high-voltage signals from reaching downstream components of the circuit 40, e.g., the splitter 54. Low-frequency signals are conducted through the inductors 50, 52 to the VSD 48. If the signal that reaches the VSD 48 has a voltage above its threshold (e.g., about 28V), then the VSD 48 conducts and the signal voltage provided to the splitter 54 is clamped to the threshold voltage.

The splitter 54 is configured to divide the incoming signal received at the input 42, transmitted through the fuse 46 and past the inductors 50, 52 and the VSD 48, into three output signals. The output signals are provided to the respective outputs 56, 58, 60. The splitter 54 is preferably tuned to match the impedance of the upstream portion of the circuit 40 (here, the fuse 46, the inductors 50, 52, and the VSD 48). Here, the splitter 54 is a custom-made splitter from MicroSignals of Palisades Park, N.J.

Figure 5:
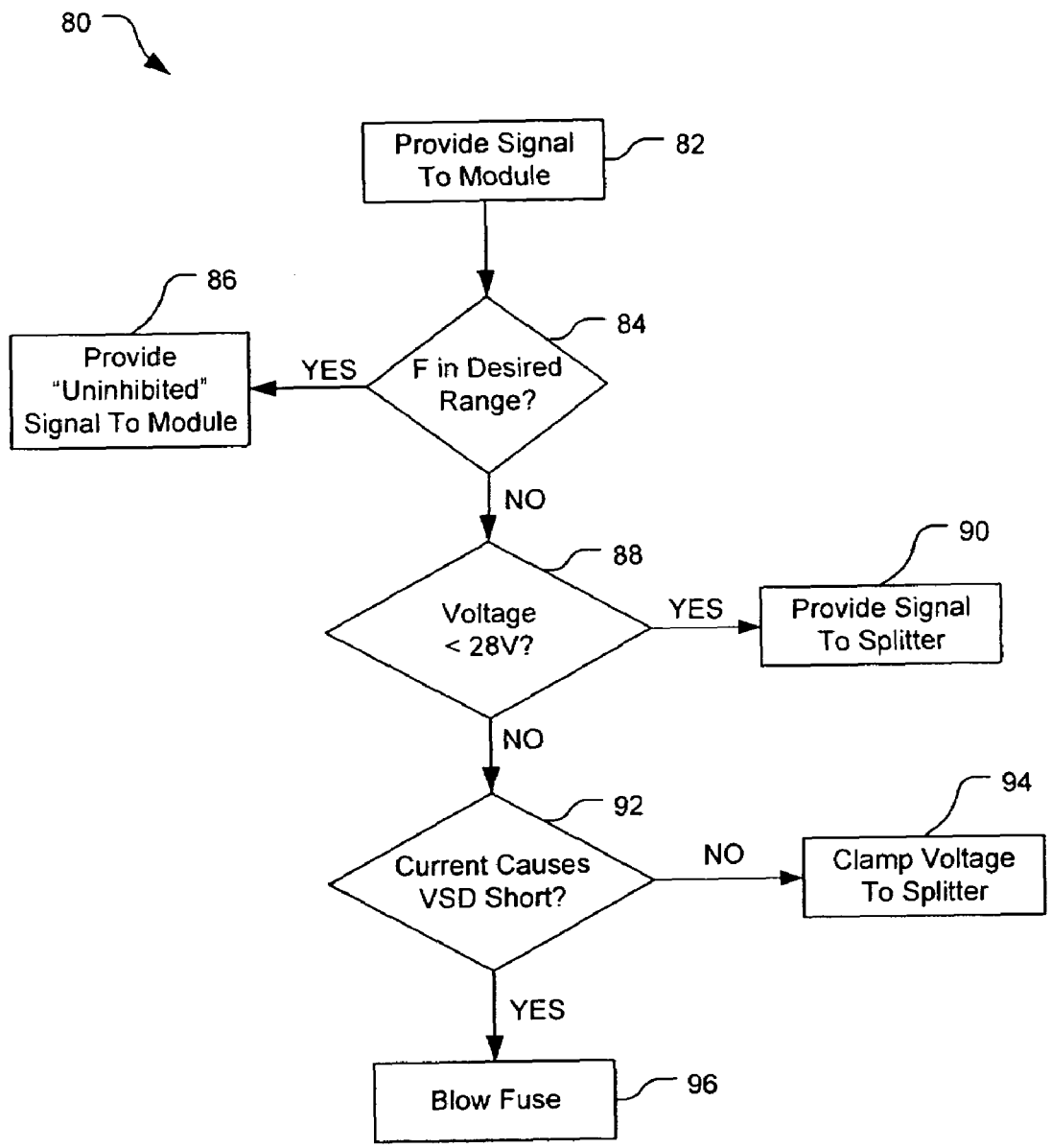
FIG. 5 is a simplified block flow diagram of a process of providing surge protection for incoming signals and splitting the incoming signals.

In operation, referring to FIG. 5, with further reference to FIGS. 1-4, a process 80 for providing surge protection for incoming signals and splitting the incoming signals using the module 20 includes the stages shown. The process 80, however, is exemplary only and not limiting. The process 80 may be altered, e.g., by having stages added, removed, or rearranged.

At stage 82, a signal is provided to the module 20. A connector is connected to (or has been previously connected to) the input connector 22, 42 of the module 20 and a signal is transmitted into the input 22, 42.

At stage 84, the frequency of the received signal is assessed. If the frequency of the received signal is in a desired range is such that the corresponding impedance of the inductors 50, 52 is relatively high compared to the impedance looking into the splitter 54 (e.g., the frequency is in the desired range), then the signal is substantially isolated from the VSD 48 and the process 80 proceeds to stage 86. At stage 86, the received signal is transmitted to the splitter 54 substantially unaffected by the VSD 48 and inductors 50, 52. If the frequency of the incoming signal is not in the desired range, then the process 80 proceeds to stage 88.

At stage 88, the voltage of the incoming signal is assessed relative to the VSD-conducting voltage. If the input voltage is below the VSD-conducting voltage, then the VSD 48 does not substantially conduct and the process 80 proceeds to stage 90 where the signal is provided to the splitter 54 which could introduce significant attenuation to this signal. If the input voltage is at or above the VSD-conducting voltage, then the process 80 proceeds to stage 92 where the VSD 48 conducts.

At stage 92, the voltage of the received signal relative to the fuse-opening current is assessed. The fuse 46 either transmits or prevents transmission of the received signal. If the voltage of the received signal causes the VSD to short, and the current is then is greater than 200 amps for an appreciable length of time, then the process 80 proceeds to stage 96. Otherwise, the fuse 46 remains intact and the process 80 proceeds to stage 94 where the voltage-clamped signal is provided to the splitter 54, which could introduce significant attenuation to this signal.

At stage 96, the fuse 46 blows. This disconnects the input 42 from the remainder of the circuit 40 and prevents the signal from reaching the components of the circuit 40 that are downstream from the fuse 46.

At stages 86, 90, and 94, the splitter 54 splits the incoming signal. The splitter 54 divides the signal received at the splitter's input into three output signals and provides those signals to the outputs 56, 58, 60 for transmission to any connectors connected to the corresponding output connectors 22.

The process 80 applies to multiple signals, e.g., with different frequencies. Multiple superimposed signals may be received by the input 42 at each signal is processed according to the process 80. If at any time a signal is no longer provided to the input 42, then the process 80 with respect to that signal terminates. If at any time a new signal (whether or not another signal is present) is provided to the input 42, then the process 80 begins with respect to that signal. If, however, the fuse 46 has been blown, then the process 80 is moot.

While the process 80 shows a progression of stages, one or more of these stages can be performed simultaneously. For example, while the signal is provided to the VSD at stage 90, the fuse 46 is performing stage 84 if a signal is present. The process 80 has been shown as sequential stages for illustrative purposes, but is not confined to the order shown. Additionally, the stages may be performed in rapid succession, e.g., nearly instantaneously. Also, if at any time the input signal is stopped, then the process 80 ends.

In summary, with respect to video signals, the circuit 40 performs as follows. Normally a video signal is applied to the input 42. This signal is in the range from about 500 MHz to about 2.0 GHz and goes substantially unimpeded to the input of the splitter 54. The splitter 54 divides the signal into 3 channels and provides the split signal portions to the outputs 56, 58, 60. The inductors 50, 52 isolate the video signal from the VSD 48 which has capacitance to ground and would deteriorate the video signal quality. If there is a power surge superimposed on top of the video signal, and is greater than 28V, then the VSD 48 conducts and clamps the voltage to the splitter input and helps prevent damage to downstream electronics. If the duration and/or magnitude of the current being conducted through the VSD 48 causes the VSD 48 to fail short, then the fuse 46 is blown open to inhibit damage to the downstream electronics and overheating on the PCB 26.

Other embodiments are within the scope and spirit of the appended claims.

Figure 6:
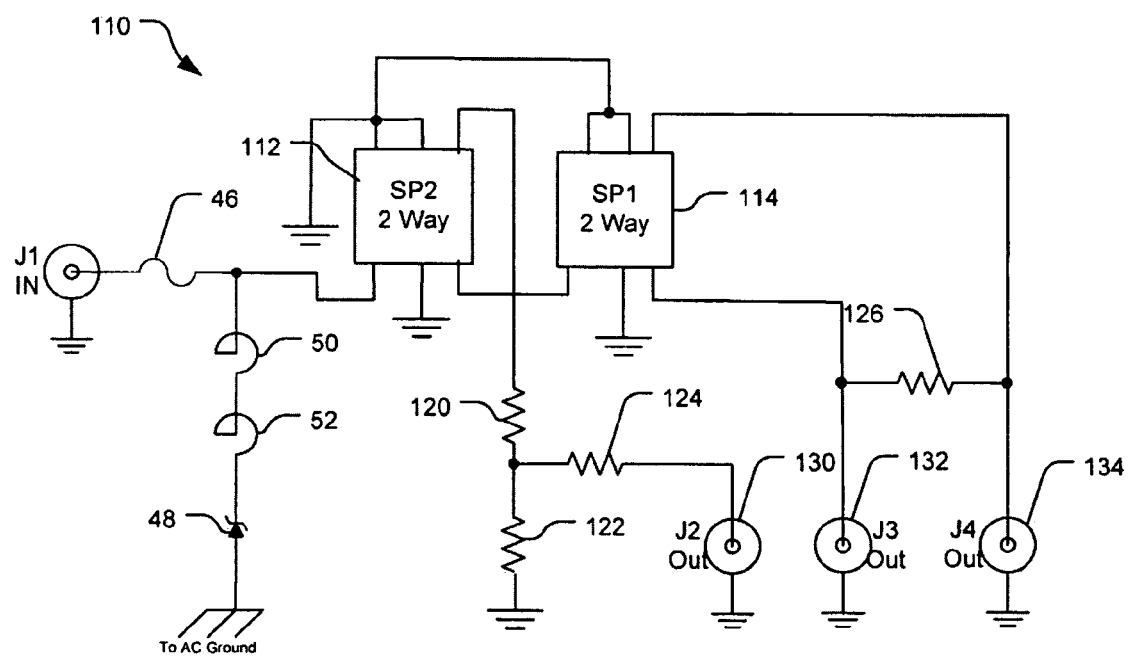
FIG. 6 is a simplified circuit diagram of another combined surge protector and 1-to-3 signal splitter.

Referring to FIG. 6, an alternative circuit 110 for providing surge protection and 1-to-3 signal splitting includes two 1-to-2 signal splitters 112, 114 connected in series, and four resistors 120, 122, 124, 126 disposed and connected as shown. The resistors 120, 122 are connected in series between an output of the splitter 112 and ground. One side of the resistor 124 is connected between the resistors 120, 122 and the other side is connected to an output 130 of the circuit 110. The resistor 126 is connected between outputs of the splitter 114 that are connected to outputs 132, 134, respectively, of the circuit 110. The resistors 120, 122, 124, 126 may be configured with different or similar characteristics. Exemplary characteristics are 200Ω and ⅛W if the resistors 120, 122, 124, 126 share similar characteristics. The splitters 112, 114 may be custom-made splitters from MicroSignals.

Figure 7:
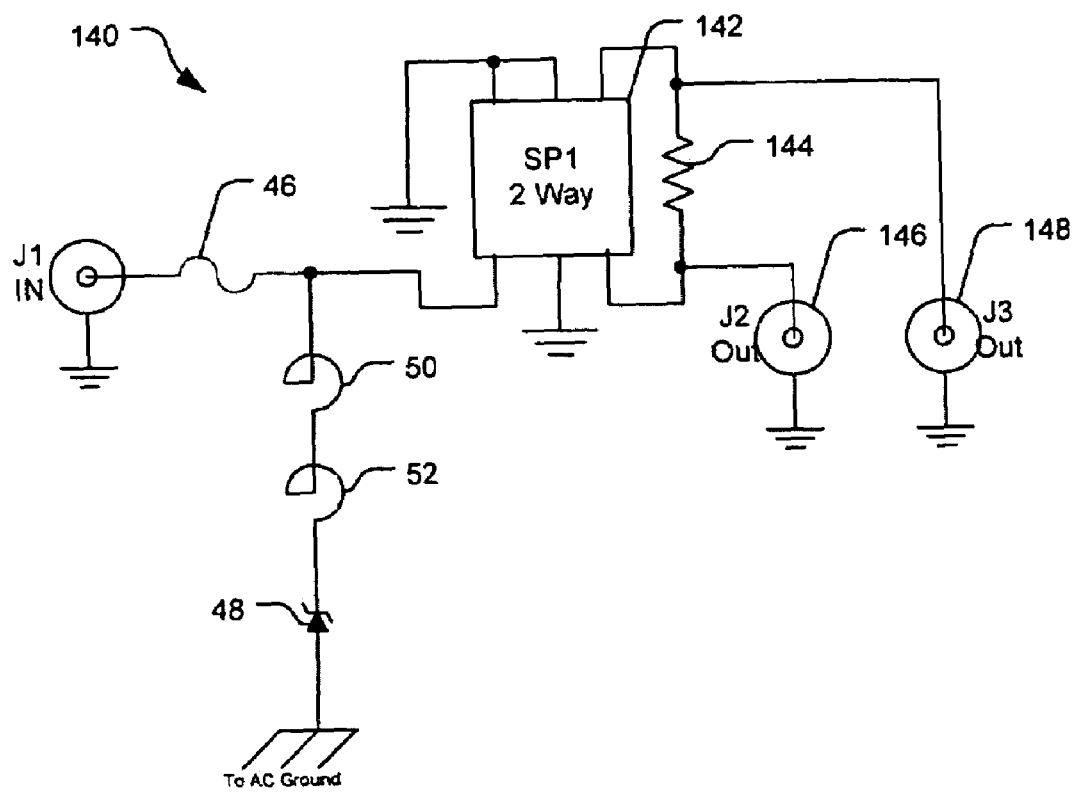
FIG. 7 is a simplified circuit diagram of a combined surge protector and 1-to-2 signal splitter.

Further, referring to FIG. 7, a circuit 140 for providing surge protection and 1-to-2 signal splitting includes a 1-to-2 signal splitter 142 and a resistor 144. The splitter 142 is, here, a custom-made splitter from MicroSignals, and the resistor 144 has characteristics of 200Ω and ⅛W. The resistor 144, as shown, is connected between outputs of the splitter 142 that are coupled to corresponding outputs 146, 148 of the circuit 140.

Still other embodiments are within the scope of the invention. For example, while the description above refers to the invention, more than one invention may be described. Further, the circuit 40 can be used in other configurations and for other uses, such as in a 4-channel wide chassis for home uses and/or corded surge protectors like the PR11T3V5 made by American Power Conversion Corporation of West Kingston, R.I.

What is claimed is:

1. A circuit for providing surge protection and signal splitting, the circuit comprising:
    an input configured to received a signal;
    a current-limiting device having first and second portions, the first portion coupled to the input, the current-limiting device being configured to provide a short circuit between the first and second portions in the absence of an excess current and to provide an open circuit in response to the excess current;
    a voltage suppression device coupled to the second portion of the current-limiting device and configured to conduct to a ground if a signal received by the voltage suppression device is above a threshold voltage;
    a signal splitter coupled to the second portion of the current-limiting device and configured to split an incoming signal into multiple output signals; and
    a plurality of outputs coupled to the signal splitter to receive the output signals;
    wherein the current-limiting device, the voltage suppression device, and the signal splitter are disposed on a single printed circuit board (PCB).

2. The circuit of claim 1 further comprising an inductor coupled in series between the second portion of the current-limiting device and the voltage suppression device and configured to have a high impedance relative to an input impedance of the signal splitter if the signal at the second portion has a frequency in a desired frequency range.

3. The circuit of claim 2 wherein the inductor comprises multiple inductors coupled in series.

4. The circuit of claim 2 wherein the inductor is a ferrite inductor.

5. The circuit of claim 2 wherein the desired frequency range is above about 500 MHz.

6. The circuit of claim 1 wherein the signal splitter is coupled to the second portion of the current-limiting device without an intermediate connector.

7. The circuit of claim 1 wherein the current-limiting device is a fuse.

8. The circuit of claim 7 wherein the fuse is coupled to the signal splitter with a metallic trace of a first width, and wherein the fuse comprises a metallic trace of a second width substantially smaller than the first width.

9. The circuit of claim 8 wherein the second width is about 40% of the first width.

10. The circuit of claim 9 wherein the first width is about 0.05 inches and the second width is about 0.02 inches.

11. The circuit of claim 1 wherein the threshold voltage is about 28 volts.

12. A replaceable module for use in rack-mounted equipment for providing surge protection and signal splitting, the module comprising:
    a housing configured to be removably inserted into a chassis configured to mount in an equipment rack;
    an input connector configured to connect to a mating connector and to receive electric signals;
    a fuse coupled to the input connector, the fuse being configured to provide a short circuit in the absence of an excess current and to provide an open circuit in response to the excess current;
    a voltage suppression device coupled to the fuse and configured to conduct to a ground if a signal received by the voltage suppression device is above a threshold voltage;
    a signal splitter coupled to the fuse and configured to split an incoming signal received by the splitter from the fuse into multiple output signals; and
    a plurality of output connectors coupled to the signal splitter to receive the output signals;
    wherein the fuse, the voltage suppression device, and the signal splitter are disposed on a single printed circuit board (PCB).

13. The module of claim 12 wherein the signal splitter is coupled to the fuse without an intermediate connector.

14. The module of claim 12 further comprising means, coupled in series between the fuse and the voltage suppression device, for inhibiting signals having frequencies in a desired frequency range from reaching the voltage suppression device.

15. The module of claim 14 wherein the threshold voltage is about 28 volts and the desired frequency range is from about 500 MHz to about 2 GHz.

16. The module of claim 12 wherein the fuse is coupled to the signal splitter by a metallic trace of a first width and the fuse comprises a metallic trace of a second width that is substantially smaller than the first width such that a current of 200 amps will cause the fuse to provide the open circuit.

17. The module of claim 12 wherein the signal splitter is configured to split the incoming signal into three output signals.

18. The module of claim 17 wherein the signal splitter comprises two 1-to-2 signal splitters coupled in series.

19. A rack-mountable system for providing surge protection and signal splitting for a plurality of input video signals, the system comprising:
    a chassis configured to be mounted in an equipment rack;
    a plurality of video signal modules configured to be removably inserted into the chassis, the modules each comprising:
        an input connector configured to connect to a mating connector and to receive electric signals;

a fuse coupled to the input connector, the fuse being configured to provide a short circuit in the absence of a current exceeding a current threshold and to provide an open circuit in response to the excess current;

a voltage suppression device coupled to the fuse and configured to conduct to a ground if a signal received by the voltage suppression device is above a voltage threshold;

a signal splitter coupled to the fuse and configured to split an incoming signal received by the splitter from the fuse into multiple output signals;

a plurality of output connectors coupled to the signal splitter to receive the output signals; and a signal inhibitor coupled in series between the fuse and the voltage suppression device and configured to inhibit signals having frequencies in a desired frequency range from reaching the voltage suppression device;

wherein the fuse, the voltage suppression device, the signal splitter, and the signal inhibitor are disposed on a single printed circuit board (PCB).

20. The system of claim 19 wherein the signal splitter is coupled to the fuse without an intermediate connector.

21. The system of claim 19 wherein the signal splitters are each configured to split the corresponding incoming signal into either two output signals or three output signals.

* * * * *